United States Patent [19]

Taylor, Sr. et al.

[11] Patent Number: 4,684,967

[45] Date of Patent: Aug. 4, 1987

[54] LOW CAPACITANCE TRANSISTOR CELL ELEMENT AND TRANSISTOR ARRAY

[75] Inventors: David L. Taylor, Sr., Monument; Hugh N. Chapman, Colorado Springs, both of Colo.

[73] Assignee: Integrated Logic Systems, Inc., Colorado Springs, Colo.

[21] Appl. No.: 607,282

[22] Filed: May 4, 1984

[51] Int. Cl.[4] ............................................. H01L 29/78
[52] U.S. Cl. ................................ 357/23.11; 357/23.14; 357/42; 357/23.1; 357/45; 357/47; 357/48; 357/59
[58] Field of Search ................. 357/23.14, 23.11, 23.2, 357/23.1, 45, 59, 52, 47, 48, 42

[56] References Cited

U.S. PATENT DOCUMENTS

| | | | |
|---|---|---|---|
| 3,348,062 | 10/1967 | Carlson et al. | 357/23.1 X |
| 3,454,844 | 7/1969 | Dill | 357/23.14 |
| 3,634,787 | 1/1972 | Newell | 357/23.1 X |
| 3,936,862 | 2/1976 | Moyle | 357/23.11 X |
| 3,967,988 | 7/1976 | Davidsohn | 357/23.11 X |
| 4,240,093 | 12/1980 | Dingwall | 357/42 |
| 4,271,422 | 6/1981 | Ipri | 357/42 |
| 4,370,669 | 1/1983 | Donley | 357/51 X |
| 4,404,579 | 9/1983 | Leuschner | 357/23.11 X |

FOREIGN PATENT DOCUMENTS

| | | | |
|---|---|---|---|
| 0132276 | 11/1978 | Japan | 357/23.11 |
| 0130170 | 10/1980 | Japan | 357/23.11 |
| 0007479 | 1/1981 | Japan | 357/23.14 |
| 0015075 | 2/1981 | Japan | 357/23.14 |
| 0201066 | 12/1982 | Japan | 357/23.14 |

Primary Examiner—Martin H. Edlow
Assistant Examiner—William A. Mintel
Attorney, Agent, or Firm—Timothy J. Martin

[57] ABSTRACT

A transistor cell element that may be used alone or in a matrix array in large scale integrated circuits includes a substrate onto which an isolation region is fabricated. Inner and outer charge carrier regions having a high density of first charge carriers is formed in the substrate to define a channel region therebetween. The inner carrier region is adjacent the isolation region so that the channel region extends in a closed loop from said isolation region, around the inner carrier region and back to the isolation region, with the outer carrier region surrounding the isolation and channel regions. The channel region has a low density of second charge carriers, having opposite charge than the first charge carriers, and a gate structure including a conductive band and an insulating layer is formed over the channel region. In one alternate embodiment, additional isolation regions may be provided with these regions interrupting the channel region. In another alternate embodiment, the isolation region extends across the cell element and divides the inner and outer carrier regions and the channel region each into two sections. On one side of the isolation region, the inner and outer carrier regions have first charge carriers with the associated channel having second charge carriers; on the other side of the isolation region, the inner and outer carrier regions have second charge carriers with the associated channel region having first charge carriers.

5 Claims, 11 Drawing Figures

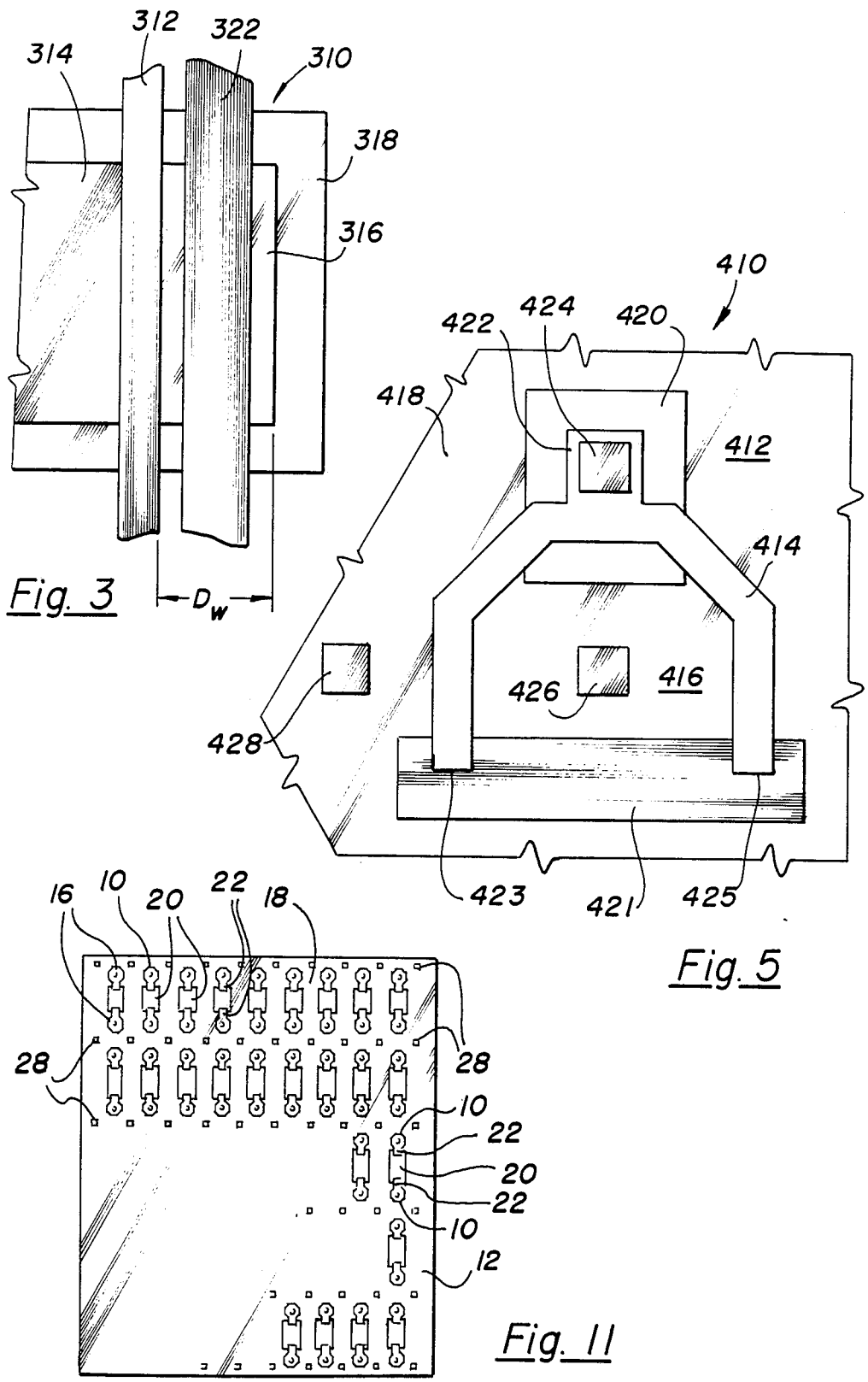

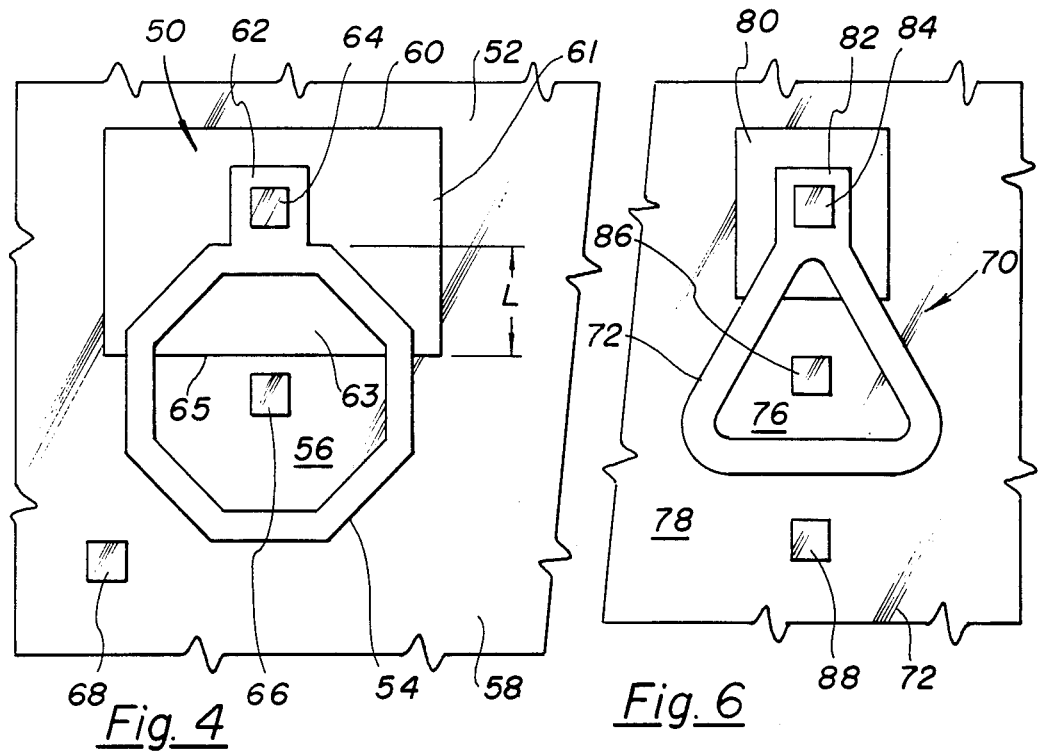
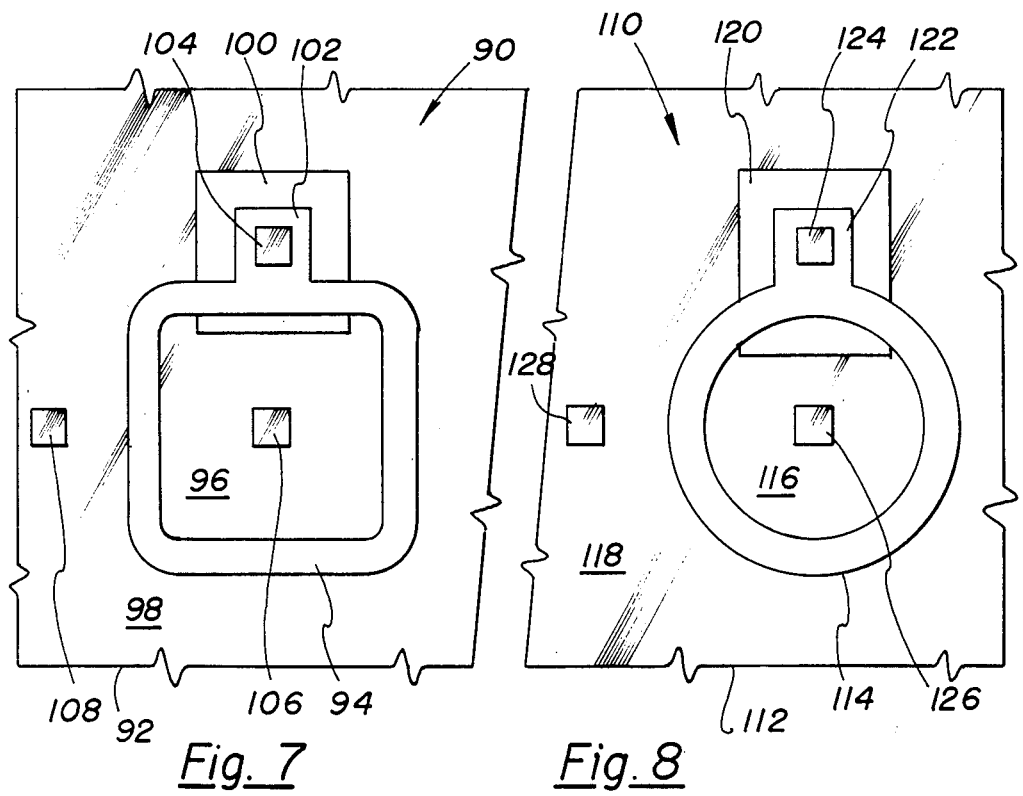

LOW CAPACITANCE TRANSISTOR CELL ELEMENT AND TRANSISTOR ARRAY

BACKGROUND OF THE INVENTION

The present invention relates to the fabrication of a low capacitance transistor cell element particularly adaptable for use in both large and very large scale integrated circuits. By being constructed to have a lower capacitance for effective transistor size, the present invention permits fabrication of higher density array devices that are both faster and more efficient than existing integrated circuits. The size of the transistor element according to the present invention allows the chip fabricator to reduce the size of an integrated circuit chip whereby the dice yield realized from standard wafer fabrication techniques is greatly enhanced, and the costs of such integrated circuits are correspondingly reduced.

In the last 20 years, improvements in fabrication technology have permitted integrated circuits to become so dense that a single chip may contain hundreds of thousands of transistor cell elements. Indeed, very large scale integrated systems containing millions of transistor elements, are anticipated with these transistor elements acting as switches with, which digital systems may be designed. The present invention is directed toward a transistor cell element that can be utilized in an array for such large scale integrated systems as a step toward further densifying the electronic circuitry in such devices.

The basic properties of a metal-oxide-semiconductor (MOS), field-effect transistor (FET) have been understood for some time, and the fabrication of MOSFET transistor cell elements has been known and employed in the design of large scale integrated circuits. Typically, integrated systems and MOS technology contain three levels of conducting material separated by intervening layers of insulating material. The actual transistor cell is formed of diffusion regions which are crossed by paths of polysilicon so that a channel region is defined underneath the polysilicon, and the polysilicon is separated from the channel by a relatively thin layer of oxide material. The polysilicon path, otherwise known as the gate, acts as a switch for the electrical part between a pair of separated diffusion regions. One side of the diffusion region is known as the source, and the other side of the diffusion region is commonly known as the drain. In the absence of a biasing voltage on the gate, no current flows between the source and the drain; however, when a switching voltage is placed on the polysilicon gate, charge carriers are drawn into the channel region so that an electrical route is provided between the source and the drain. The polysilicon gate is separated from the substrate by a layer of thin oxide, as noted above, which forms a capacitor that is an inherent part of the transistor element. Additional capacitance factors are inherent in MOSFET design, predominantly as a result of depletion regions and diffusion edge effects. The total capacitance of this transistor cell element greatly affects the response time of the system of transistor cell elements since several transistors must be interconnected to produce a logic circuit.

Traditional fabrication techniques for transistor cell elements generate rectangularly-shaped transistor elements wherein facing rectangular regions contain diffused dopant which are separated by a linear channel region and are bounded by isolation regions extending therearound. The resistance of such a transistor cell element decreases with an increase in its width, as defined by the length of the channel, but the capacitance of the element increases as the width increases. While the gate to channel capacitance is normally the largest capacitance for a given transistor cell element, another significant capacitance occurs where a diffusion layer, for example an n-type diffusion forming the drain, is positively biased with respect to the bulk silicon and the isolation region. The positive biasing on the n-type region causes a depletion layer to be formed beneath the diffusion. Accordingly, a capacitance region is formed that is proportional to the area of the drain and inversely proportional to the thickness of the depletion layer. Since the isolation region for this type of device is normally highly doped p-type material that receives the voltage bias of the well in which it is formed, with the well usually being held at ground potential, there is a substantial capacitance between the sidewall of the isolation region and the drain. It is desireable to minimize the total capacitance of the transistor element, where possible.

While prior art devices comprising the linear transistor cell elements have proved quite functional in fabrication and operation, there remains a need for a lower capacitance transistor cell element configuration which can reduce the costs and improve the performance of large scale integrated devices. The development of the transistor cell element having a large effective transistor width while having a lower capacitance is needed for use in an array where such can be produced by existing fabrication technology.

SUMMARY OF THE INVENTION

It is an object of the present invention to construct a low capacitance transistor cell element which, through its novel and nonobvious structure, is useful in the generation of large scale integrated circuits.

It is another object of the present invention to provide a transistor cell element wherein, for a given transistor width, the drain capacitance is minimized.

It is yet another object of the present invention to provide a low capacitance transistor cell element wherein the source and drain are self-isolated from one another.

A still further object of the present invention is to provide a transistor element wherein a low capacitance element is produced that may be utilized in producing a higher density array for large scale integrated circuits.

To accomplish these objects, the present invention is directed to a transistor cell element which is adapted for use in large scale integrated circuit fabrication utilizing existing wafer technology. As such, the present transistor cell element is intended to be fabricated as a channel device on a small portion of substrate material, for example, a silicon wafer, and is especially adaptable as a MOSFET device that provides traditional switching capability with reduced overall size and capacitance. Thus, the transistor cell element according to the preferred embodiment of the present invention is fabricated upon a substrate that is formed of a semiconductor material having a relatively low density of first charge carriers. A gate structure is formed on top of this substrate material in a substantially closed loop, to define an inner surface region having a diffusion layer that extends into the surface of the substrate, and an outer surface region also having a diffusion layer that extends into the substrate. Both of the diffusion regions, that is, the inner surface region and the outer surface region, have a relatively high density of second charge carriers and face each other to define a channel region underneath the gate structure. Thus, the channel region contains a relatively low density of the first charge carriers since it is formed out of the substrate material. The gate structure includes a band of electrically conductive material, such as polysilicon, that is insulated from the channel region and the diffusion layers by means of a thin layer of oxide material.

The channel region is preferably ring-shaped, being formed as a substantially closed loop in the shape of a polygon, with the preferred shape being an octagon. In order to provide for electrical contact to the gate structure, an isolation region underlies a small portion of the gate structure and thus interrupts the channel by extending laterally into the inner and outer surface regions. A contact pad is formed on top of this isolation region so that an electrical contact may be made to the polysilicon band. This isolation region is relatively thick in comparison to the oxide layer that is formed underneath the polysilicon band, and the isolation region may be adjusted in size for different lateral extensions to affect the transistor characteristics of the cell element.

In one alternate form of this invention, two or more isolation regions are provided and the channel region is defined by channel region segments extending between the isolation regions. Thus, the isolation regions and the segments enclose a drain area that is common to all the channel segments. A common source area surrounds the drain area on an opposite side of the channel region segments. The gate structures for these segments are formed by polysilicon bands oriented above the respective segments and isolated therefrom by a layer of insulating oxide. The gate structures are integrally interconnected so that the segment system defines an effective plurality of transistor elements connected in parallel and all having a common source, gate and drain but having different, descrete channels.

In a second alternate form of the present invention, a dual low capacitance transistor cell element may be fabricated by extending an isolation region completely across the closed loop to separate the inner surface region into two distinct areas of diffusion. The first of the inner regions has charge carriers of a first type and the other of the inner surface regions has charge carriers of an opposite type. The isolation region also separates the outer surface region into a first outer surface region which faces the inner surface region across a first channel portion, with this first outer surface region having charge carriers the same as the first inner surface region. Similarly, the second outer surface region faces the second inner surface region across a second channel portion and has the opposite charge carriers as does the first inner surface region. The charge carriers in the two channel regions are opposite the charge carriers in their respective inner and outer surface regions. The closed loop gate structure then extends over the channel regions, and the two inner surface regions may be electrically connected to produce a single cell, low capacitance inverter element.

These and other objects of the present invention will become more readily appreciated and understood from a consideration of the following detailed description of the preferred embodiment when taken together with the accompanying drawings, in which:

BRIEF DESCRIPTION OF THE DRAWINGS

FIG. 3 is a top plan view of the typical prior art transistor cell element;

FIG. 4 is a top plan view of a first alternate embodiment of the present invention;

FIG. 5 is a top plan view of a second alternate embodiment of the present invention;

FIG. 6 is a top plan view of a third alternate embodiment of the present invention;

FIG. 7 is a top plan view of a fourth alternate embodiment of the present invention;

FIG. 8 is a top plan view of a fifth alternate embodiment of the present invention;

FIG. 11 is a matrix array of transistor cell elements such as shown in FIG. 1.

DETAILED DESCRIPTION OF THE PREFERRED EMBODIMENT

The present invention relates to the structure of a low capacitance transistor cell element and a matrix array of the same. Since the present invention is adapted for use in large scale integrated circuits, it should be appreciated that this transistor cell element may form a single element in a matrix of several thousand transistor cell elements. As such, the preferred embodiment of the present invention is particularly useful for creating high density micro-chip devices which are both faster and more efficient than many existing integrated circuits.

Figure 1:
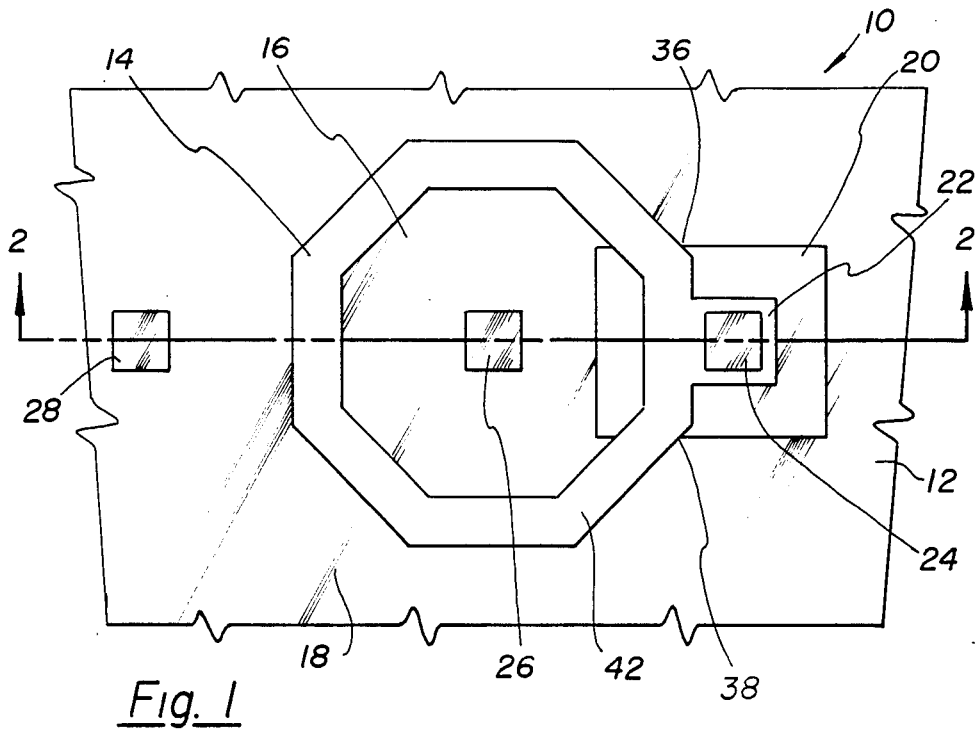
FIG. 1 is a top plan view of a transistor cell element according to the preferred embodiment of the present invention.
Figure 2:
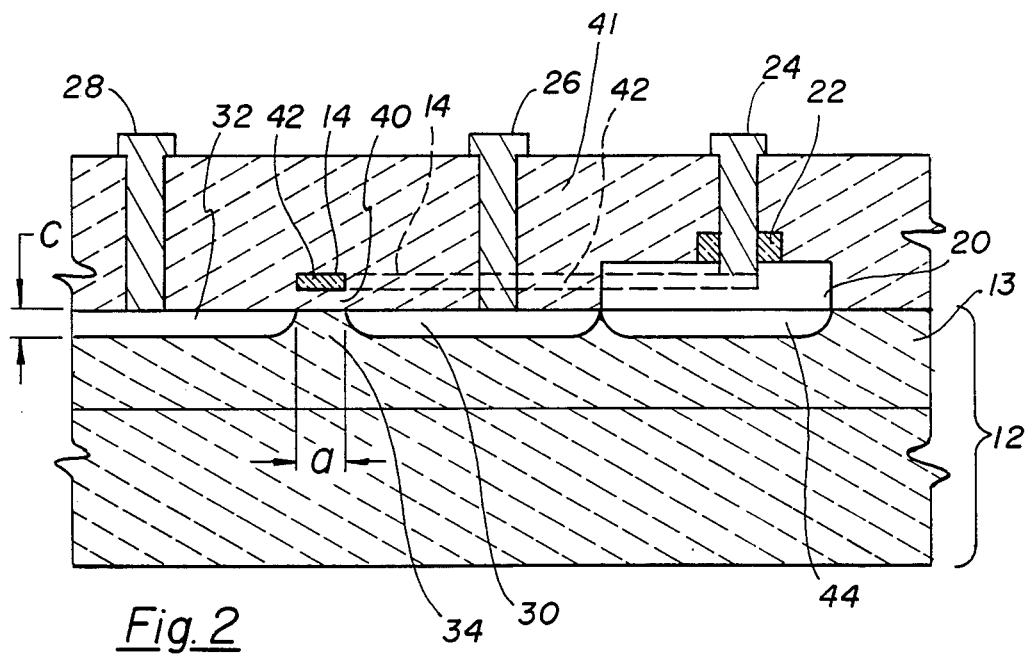
FIG. 2 is a cross-sectional view taken about line 2—2 of FIG. 1.

The preferred embodiment of the present invention is shown in FIGS. 1 and 2 wherein it should be appreciated that transistor cell element 10 is shown in representative form understandable to one ordinarily skilled in the art. Specifically, transistor cell element 10 is shown fabricated on a substrate 12 which may be in a small portion of the typical silicon wafer that is doped with impurities to form a well 13 that has a relatively low density of charge carriers. It should be appreciated that the entire substrate could be doped so there would be no need for a well. For the sake of description as is shown in FIG. 2, the substrate 12 has an $n^-$ doping level, and well 13 has a $p^-$ doping level and forms a field onto which transistor cell element 10 is formed. This type of structure is used primarily in the creation of nMOS devices within CMOS integrated circuits; however, it should be appreciated that pMOS devices are within the scope of this invention.

With greater particularity, transistor cell element 10 comprises a gate structure 14 that extends in a substantially closed loop along the surface of substrate 12 to separate the surface of substrate 12 into an inner surface region 16 surrounded by gate structure 14, and an outer surface region 18 that surrounds gate structure 14. An isolation region 20 is formed on substrate 12 and underlies a portion of gate structure 14 with the purpose of this isolation region 20 being described below. Preferably, isolation region 20 is composed of an insulating material, such as $SiO_2$. A contact pad 22 is formed integrally with gate structure 14 on the upper surface of isolation region 20 and mounts a contact 24. A second contact 26 is positioned in electrical contact with inner surface region 16, and a third contact 28 is placed in electrical contact with outer surface region 18. Contacts 24, 26 and 28 permit the making of electrical connection to transistor cell element 10, as is also described more thoroughly below.

As is shown in FIG. 2, inner surface region 16 and outer surface region 18 of well 13 have diffused into substrate 12 a relatively high density of impurities so that a diffusion layer defines an inner carrier region or drain 30 having charge carriers that have an opposite electrical charge from well 13. Likewise, outer surface region or source 18 has a diffusion layer defining outer carrier region 32 that has a relatively high density of charge carriers which are of the same charge as the charge carriers in region 30. Inner carrier region 30 and outer carrier region 32 are separated a distance "a" which is on the order of 2–3 microns so that a channel region 34 is formed therebetween. Channel region 34 has a depth typically on the order of 0.02 to 0.03 microns. The diffusion layers, on the other hand, typically have a depth "c" on the order of 0.5 to 1.0 microns. Gate structure 14 is positioned on the upper surface of channel region 34. Thus, it should be appeciated that channel region 34 and isolation region 20 form a substantially closed loop along the surface of substrate 12 with channel region 34 extending from a side 36 of isolation region 20 to the opposite side 38 of isolation region 20. Additionally, it should now be appreciated that inner carrier region 30 is isolated from outer carrier region 32 by the structural combination of isolation region 20 and channel region 34.

Gate structure 14 comprises a layer 40 of insulating material, such as silicon dioxide, which is relatively thin and which is positioned immediately on top of channel region 34. Typically, layer 40 has a thickness of approximately 0.05 microns and may be formed integrally with protective oxide layer 41. Layer 40 supports a band 42 of conductive material, such as polysilicon, that has approximately the same width "a" as layer 40 which also corresponds to the width of channel region 34. Contact pad 22 is formed integrally with band 42 so that it defines a portion of an electrically conductive region. A relatively thin implant layer 44 is formed in well 13 underneath isolation region 20 and has a higher density of charge carriers than that of well 13 with a charge the same as those in well 13 but opposite the charge carriers in region 30. The junction of region 30 and layer 44 is thus fabricated to be a reverse or zero biased junction when the transistor 10 is used.

It should now be appreciated that the preferred embodiment of the present invention, as is shown in FIGS. 1 and 2, may be used as a MOSFET device in a logic array. This MOSFET may be electrically biased so that outer carrier region 32, which is doped at an n+ density level to a depth of "c", may serve as a source for the MOSFET device. Inner carrier region 30 is also doped to a diffusion level "c" with a density of carriers of n+ and serves as the drain for the MOSFET device. Accordingly, electrical contacts 26 and 28 provide connection to the drain and source of this device, respectively. Channel region 34 has a p− carrier doping density and has gate structure 14 superimposed thereover. Contact 24 provides electrical connection to conductive band 42 so that gate structure 14 forms the gate of the MOSFET device.

In normal operation of such an nMOS device, the drain, or inner carrier region 30, is connected to a positive voltage, and the source, or outer carrier region 32, is connected to ground. When no voltage is placed on conductive band 42, there is no current flow between the source and drain regions since channel region 34 prevents migration of negative charges thereacross. However, when a voltage equal to or exceeding the gate threshhold voltage potential is placed on band 42, electrons in well 13 are drawn upwardly into channel region 34 and positive carriers are repelled so that the net effect switches channel region 34 from having a low density of positive carriers to having a low density of negative carriers. In other words, the p− doping density of channel region 34 is transformed into an n− doping density. When this transformation occurs, at the threshhold voltage, a current may now flow between the source and the drain. When the voltage is removed from conductive band 42, the electrons that were drawn into channel region 34 are no longer retained therein and return to the bulk well 13. The current between the source and drain thus ceases. In this manner, the MOSFET acts as a switching device.

Of particular significance in the present invention is the lower capacitance for a given transistor width. The transistor width is defined to be the effective distance that its channel extends around its drain. As is shown in FIG. 1, the preferred embodiment of the present invention has a gate structure 14 which is formed as a regular octagon. Except for the volume forming isolation region 20, channel region 34 is congruent with gate structure 14 and, therefore, the transistor width approximates the inner perimeter of this octagon less the portion blocked by isolation region 34.

Capacitance of a channel transistor comes from the bottom junction capacitance and from the sidewall junction capacitance. The bottom junction capacitance is a function of the drain area and the sidewall area along the channel; the sidewall junction capacitance is a function of the area of the "sidewall" along the implant layer 44. Thus, the effective capacitance is proportional to:

$$A_{TOTAL} = A_{DRAIN} + x_j(T_w + C_R P_L)$$

where:
 $A_{TOTAL}$ = Total effective capacitive area
 $A_{DRAIN}$ = Area of the drain
 $x_j$ = Junction depth
 $T_w$ = Transistor width
 $P_L$ = Perimeter width between drain and layer 44
 $C_R$ = Ratio of the capacitance of the implant layer/inner carrier layer junction to the capacitance of the gate region/inner carrier layer junction Typically, the junction depth $x_j$ is approximately 0.6 microns, and $C_R$ is approximately 2.

An example is now possible for the preferred form of the present invention, shown in FIG. 1 and the prior art shown in FIG. 3. The structure shown in FIG. 1 typically has a drain area of approximately 60 microns$^2$ where $T_w$=31 microns, $P_L$=6 microns, $C_R$=2 and $x_j$=0.6 microns$^2$. Thus, $A_{TOTAL}$ for the present invention approximately equals 86 microns. In FIG. 3, transistor cell 310 has a gate 312, a source 314 and a drain 316. An isolation region 318 extends completely around drain 316 and is contacted by interconnect 322. Here, the transistor width $T_w$ is selected to be 31 microns so that it is the same as the $T_w$ for FIG. 1, and the drain width $D_w$ typically equals 8 microns. Using the same $X_j$ and $C_R$, the capacitive area of this prior art device is: $A_{TOTAL}$=248 micron$^2$+0.6 (31 microns+(2) (47 microns)) or $A_{TOTAL}$=323 microns$^2$. Thus, the present invention has approximately only 25% of the capacitance of the prior art transistor cell.

FIG. 11 shows a matrix of transistor cell elements 10, as would be typical in the fabrication of large and very large scale integrated circuits. In FIG. 11, cells 10 are formed as pairs which have their respective contact pads 22 facing each other on a common isolation region 20. Here, all of cells 10 have a common outer or source region 18 that is formed in substrate 12, and a plurality of contacts 28 are positioned on region 18 to permit a fairly uniform electrical potential to be placed on region 18 which defines the source for all of the transistor cell elements 10. Each cell 10 thus has its own "self-isolated" drain region 16 as well as a gate 14 as described with respect to FIGS. 1 and 2. FIG. 11 shows an m-row, n-column matrix array of cells 10, where m and n are positive integers. It should be appreciated that a random matrix array, where the cells 10 are not aligned in rows or columns, could be fabricated without departing from the scope of this invention but that the rectangular array is preferred because it is an ordered arrangement and therefore more manageable.

As noted above, isolation region 20 in FIG. 1 underlies a small portion of gate structure 14 and interrupts channel region 34 by having a portion extending laterally into the outer surface region and a portion extending laterally into said first inner surface region. By comparing FIG. 4 with FIG. 1, it is seen that the extension of the isolation region into the drain region of the MOSFET device may be controlled for a given gate structure size so that the width of the MOSFET and area of the drain may be modified. FIG. 4 thus shows an alternate embodiment of the present invention which comprises a transistor cell element 50 formed on a substrate 52. Gate structure 54 is oriented on the surface of substrate 52 to divide the surface region of substrate 52 into an inner surface region 56 and an outer surface region 58. An isolation region 60 is formed under a portion of gate structure 54 so that it includes a portion 61 extending laterlly from gate structure 54 into outer surface region 58. A second isolation portion 63 extends laterally from gate structure 54 into inner surface region 56. It should be appreciated that portion 63 is formed into inner surface region 56 a distance "l" that is measured from edge 65 of isolation region 20 perpendicularly to the perimeter of gate structure 14. A contact pad 62, formed of conductive material such as polysilicon, is formed integrally with the conductive layer of gate structure 54, and is positioned over isolation region 60 so that is is electrically insulated from inner surface region 56 and outer surface region 58. An electrical contact 64 is positioned on contact pad 62 so that electrical connection may be made to gate structure 54. Contact 66 is provided to make electrical connection to inner surface region 56, and contact 68 is provided to make electrical connection to outer surface region 58. From the foregoing, it should be appreciated that the structure of transistor cell element 50 is substantially the same as transistor cell element 10 except for the size and positioning of isolation region 60 in comparison with isolation region 20.

Another alternate embodiment of this invention is shown in FIG. 5. Here, a second isolation region cooperates with the channel to form a substantially closed loop that defines the transistor drain. Specifically, transistor cell 410 includes a U-shaped gate structure 414 that is placed on substrate 412. A first isolation region 420, similar to isolation region 20 in FIGS. 1 and 2, underlies a portion of gate structure 414, and a contact 424 is formed on a contact pad 422 in the manner described with respect to the preferred embodiment. A second isolation region 421, that is formed the same as isolation region 420, extends across free ends 423 and 425 of U-shaped gate 414 on substrate 412. Thus, gate 414 and isolation region 420 and 421 separate substrate 412 into an inner surface region 416 and an outer surface region 418, which may respectively be the drain and source of transistor cell 410. Contacts 426 and 428 are placed on regions 416 and 418, respectively, to permit electrical connection to the transistor source and drain.

The fabrication and doping procedures for transistor cell 410 are the same as those described with respect to transistor cell 10. Hence, it should be understood that a channel region underlies gate structure 414 where it is formed on the substrate 412, but no such channel region exists in either isolation region 420 or isolation region 421. Regions 416 and 418 include diffusion layers having common carriers of similar charge and density. In essence, isolation region 421 interrupts the channel region underneath gate 414, so that this alternate embodiment of the present invention contemplates the break-up of the channel region into several sections by one or more isolation regions, such as region 421. Thus, the ordinarily skilled person in this field of invention should appreciate that several isolation regions could be employed to divide the channel region into a plurality of channel sections all having a common contiguous source and a common contiguous drain; thus a plurality of transistor sections would be defined all having a common source and a common drain. By varying the size of gate 414 and the size and number of isolation regions 420 and 421, the transistor characteristics of transistor cell 410 can be modified and customized for different resistance and capacitance values, depending upon the parameters of the integrated circuit that is to be formed.

FIGS. 6, 7 and 8 show alternate geometrical configurations of a gate structure for various transistor cell elements similar in construction to the cell element of FIGS. 1 and 2, and it should be understood that the structure of these transistor cell elements are the same except for the geometrical configuration of the gate structure and underlying channel regions.

For example, FIG. 6 shows a transistor cell element 70 formed on substrate 72 and which has a triangularly-shaped gate structure 74 which divides the surface region of substrate 72 into a generally triangularly-shaped inner surface region 76 and outer surface region 78. An isolation region 80 is formed at one of the vertices of gate structure 74, and a contact pad 82 is formed integrally with gate structure 74 and is oriented over isolation region 80. Thus, contact pad 82 is electrically isolated from both outer surface region 78 and inner surface region 76. A contact 84 is positioned on contact pad 82 to allow electrical connection to the gate structure 74, and contacts 86 and 88 are respectively positioned on inner and outer surface regions 76 and 78 to permit electrical connection thereto.

FIG. 7 shows a square-shaped transistor cell element 90 formed on substrate 92 and which is provided by a square-shaped gate structure 94. The gate structure 94 separates the surface region of substrate 92 into an inner surface region 96 and an outer surface region 98. Isolation region 100 extends underneath a portion of gate structure 94, and the contact pad 102 is formed integrally with gate structure 94 and is oriented on isolation region 100. Contact pad 102 is electrically isolated from both inner and outer surface regions 96 and 98, and contact 104 is provided on contact pad 102 to provide electrical connection to gate structure 94. Contacts 106 and 108 are respectively provided on inner and outer surface regions 96 and 98 to permit electrical connection thereto.

FIG. 8 shows a transistor cell element 110 formed on a substrate 112 wherein gate structure 114 is formed in a circular pattern. Thus, gate structure 114 separates the surface region of substrate 112 into a generally circular inner region 116 and an outer region 118. An isolation region 120 extends underneath a small portion of gate structure 114, and a contact pad 122 is oriented on isolation region 120 and is formed integrally with gate structure 114. A contact 124 is supported by contact pad 122 and permits electrical contact to gate structure 114. Contacts 126 and 128 are positioned on inner and outer regions 116 and 118, respectively, to permit electrical contact thereto.

It should be appreciated from the foregoing that the alternate embodiment shown in FIG. 8 represents the idealized structure for minimizing the capacitance of a transistor cell element for a given transistor width. The reason is that the circular configuration for the gate structure, and the underlying channel region, minimizes the capacitance of the drain area and perimeter for a given transistor width. However, due to the limitation of present day fabrication technology, it has been found that the octagonal configuration of the preferred embodiment, as it is found in FIGS. 1 and 2, approximates this circular configuration yet is less difficult to employ according to existing, state-of-the-art techniques.

Figure 9:
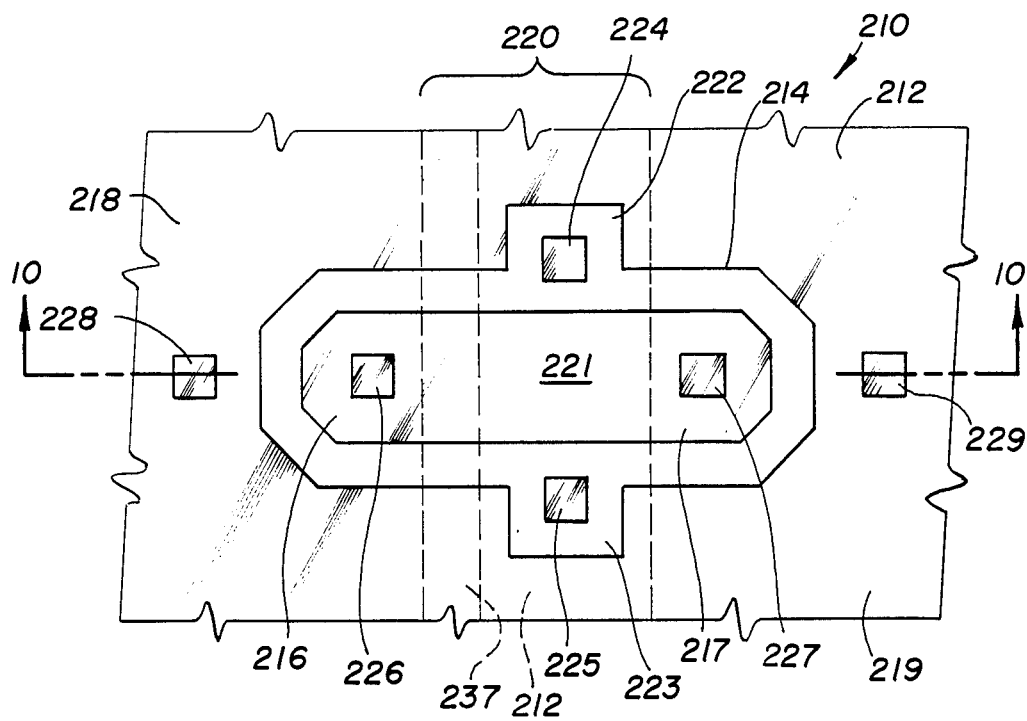
FIG. 9 is a top plan view of a fifth alternate embodiment showing the dual transistor cell element according to the present invention.
Figure 10:
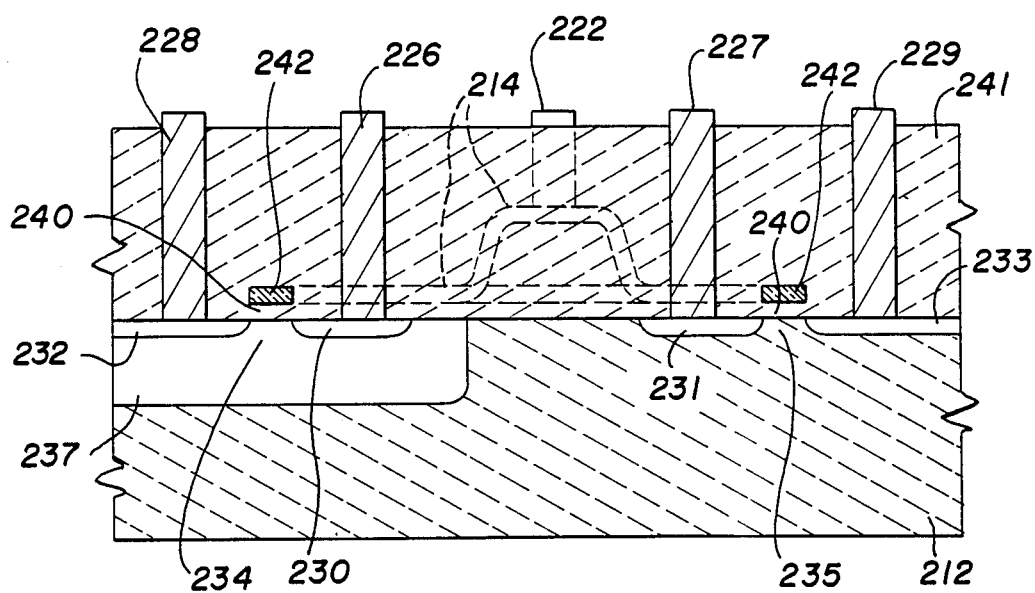
FIG. 10 is a cross-sectional view taken about line 10—10 of FIG. 9.

While the above description of the preferred embodiment of the present invention shown in FIGS. 1 and 2 and the alternate embodiments of the present invention as shown in FIGS. 4-8 relate to a single transistor cell element, the present invention contemplates the construction of a transistor device wherein the same general structure provides dual transistors so that an inverting element may be formed by a single device structure. This embodiment of the present invention is shown in FIGS. 9 and 10 wherein it should be appreciated that transistor cell element 210 is fabricated upon a substrate 212 and a well 237. A gate structure 214 is positioned on substrate 212 and is in the form of an elongated octagonal closed loop. An isolation region 220 defined by a portion of well 237 and by a portion of substrate 212 is oriented diametrically across the closed loop underneath the gate structure so that it bifurcates the inner surface region into a first inner surface region 216 and a second inner surface region 217 which are separated by an inner isolation region 221. The surface region of substrate 212 is thus also separated into a first outer surface region 218 and a second outer surface region 219 which are separated by isolation region 220.

A pair of contact pads 222 and 223 are formed integrally with gate structure 214 and are oriented on isolation region 220 so that they are electrically isolated from outer surface regions 218 and 219. Contacts 224 and 225 are positioned on contact pads 222 and 223, respectively, and permit electrical contact to be made to gate structure 214. Contacts 226 and 227 are respectively positioned on first and second inner surface regions 216 and 217 and are operative to permit electrical contact to be made to these inner surface regions. Likewise, contacts 228 and 229 are respectively positioned on first and second outer surface regions 218 and 219 to permit electrical contact thereto.

It should be appreciated from the description with respect to the preferred embodiment of the present invention that substrate 212 is doped with impurities to a low density of first charge carriers, and preferably this density may be represented by charge carrier density $n^-$. Well 237 is formed in substrate 212 by the diffusion of sufficient dopant so that it has a relatively low density of second charge carriers, such as $p^-$, having a charge opposite the first charge carriers. A first inner carrier region 230 is then formed by a diffusion layer in well 237 with first inner carrier region 230 being doped to a relatively high density of the first charge carriers, such as $n^+$, having an opposite electrical charge from the charge carriers in well 237. A first outer carrier region 232 is formed by a diffusion layer so that first outer carrier region 232 has a relatively high density of second charge carriers. Inner carrier region 230 extends along a first inner perimeter portion of gate structure 214, and it should be appreciated that the first outer carrier region 232 extends along in the matching outer perimeter portion of gate structure 214 so that carrier regions 230 and 232 face each other to define a first channel region 234 therebetween with first channel region 234 underlying a first portion of gate structure 214.

A similar channel structure is formed between second inner surface region 217 and second outer surface region 219, as is shown in the right half of FIG. 10. Here, a second inner carrier region 231 is formed by diffusion into the surface of substrate 212 and is doped to a relatively high density of second charge carriers so that it is a $p^+$ region. A second outer carrier region 233 is formed by diffusion in a similar manner and is doped to a relatively high density of second charge carriers so that it has a similar charge density to that of a second inner carrier region 231. Inner and outer carrier regions 231 and 233 define a second channel region 235 therebetween with channel region 235 underlying gate structure 214.

The construction of gate structure 214 is similar to that described with respect to gate structure 14 except for its elongated configuration. Gate structure 214 includes a layer of insulating material 240, formed of an insulating oxide such as silicon dioxide, that is rather thin in thickness and may be part of protective layer 241. Layer 240 extends above channel regions 234 and 235 and extends across isolation regions 220. A band 242 of conductive material, such as polysilicon, is positioned on top of layer 240 so that layer 240 electrically isolates band 242 from the electrically conductive regions 230, 231, 232, 233 and channel regions 234 and 235. It should also be noted that the channel regions 234 and 235 do not extend across isolation region 212 so that channel region 234 is in the form of a loop which, with isolation region 220, separates inner surface region 216 from outer surface region 218. Likewise, channel region 235 is in the form of a loop extending from isolation region 220 to separate second inner surface region 217 from second outer surface region 219.

Based on the foregoing description, it should be appreciated that an inverter element is fabricated by this construction with it only being necessary to electrically interconnect contacts 226 and 227. This is accomplished by any convenient method such as a conductive polysilicon or metal interconnect. With this configuration, a supply voltage is placed on contact 229 so that outer carrier region 233 is placed at a relatively high positive electrical potential. Contact 228 is placed at ground potential so that outer region 232 is at ground potential, and an input connection is made to one of contacts 224 and 225 so that gate structure 214, through band 242, will respond to an input voltage. Contacts 216 and 217 are interconnected electrically and this interconnect provides a contact for an output voltage.

When no charge is placed on band 242, and thus gate structure 214, electrical current flows through channel region 235 and regions 216 and 217 and therefore yields an output voltage. However, when contact 224 or 225, and thus gate structure 214 has a positive voltage potential placed thereon in excess of the threshold potential, charge carriers are forced out of channel region 235 with the oppositely charged carriers being drawn into channel 234. This establishes an electrical circuit between inner regions 230 and 232. Since region 232 is at ground, regions 216 and 217 are placed at ground potential. Thus, when an excess threshold biasing voltage is placed on gate structure 214, the output goes to ground potential, yet, when no biasing voltage is placed on gate structure 214, the output goes to a high voltage. Thus, this device acts as a single cell inverter structure.

Accordingly, the present invention has been described with some degree of particularity directed to the preferred embodiment of the present invention. It should be appreciated, though, that the present invention is defined by the following claims construed in light of the prior art so that modifications or changes may be made to the preferred embodiment of the present invention without departing from the inventive concepts contained herein.

We claim:

1. A transistor cell element adapted for use in large scale integrated circuits, comprising:
    a substrate material;
    an isolation region formed in a selected geometrical shape on said substrate material and having a surrounding perimeter;
    an inner carrier region formed in said substrate material adjacent said isolation region and having a relatively high density of first charge carriers;
    a channel region formed in said substrate and extending away from said isolation region at a first location along its perimeter, around said inner carrier region and back to said isolation region at a second location along its perimeter in a generally closed loop so that the isolation region and said channel region cooperate to enclose said inner carrier region, said channel region having a relatively low density of second charge carriers;
    an outer carrier region having a relatively high density of first charge carriers and positioned around said channel region whereby said inner and outer carrier regions face one another across said channel region;
    said isolation region extending completely across said closed loop and laterally into said outer carrier region to separate said inner carrier region into first and second inner carrier regions, said channel into first and second channel segments and said outer carrier region into first and second outer carrier regions, said first inner and outer carrier regions facing one another across said first channel segment and having a relatively high density of first charge carriers, said inner and outer carrier regions facing one another across said second channel segment and having a relatively high density of second charge carriers, said first channel segment having a relatively low density of second charge carriers and said second channel segment having a relatively low density of first charge carriers; and
    a gate structure formed over said channel region and including a band of conductive material configured to match the path of said channel region and separated therefrom by a layer of insulating material, said band having a contact portion extending over said isolation region.

2. A transistor cell element adapted for use in large scale integrated circuits, comprising:
    a substrate material;
    an elongated isolation region formed on said substrate material;
    first and second inner carrier regions formed in said substrate and facing one another across said isolation region, said first inner carrier region having a relatively high density of first charge carriers and said second inner carrier region having a relatively high density of second charge carriers, said first and second charge carriers having opposite electrical charges;
    first and second channel regions formed in said substrate on opposite sides of said isolation region, said first channel region extending away from said isolation region, around said first inner carrier region and back to said isolation region in a generally closed loop and having a relatively low density of second charge carriers, said second channel region extending away from said isolation region, around said second inner carrier region and back to said isolation region in a generally closed loop and having a relatively low density of first charge carriers;
    a first outer carrier region having a relatively high density of first charge carriers and positioned around said first channel region whereby said first inner and outer carrier regions face one another across said first channel region;
    a second outer carrier region having a relatively high density of second charge carriers and positioned around said second channel region whereby said first inner and outer carrier regions face one another across said second channel region; and
    a gate structure formed over said first and second channel regions, said gate structure including a band of conductive material configured to match the paths of said first and second channel regions and a layer of insulating material between said band and said first and second channel regions.

3. A transistor cell element according to claim 2, wherein said band is configured in an elongated octagonal shape and is formed of conductive polysilicon, said isolation region extending diametrically across said band.

4. A transistor cell element according to claim 2, including electrical contacts on said first and second inner carrier regions, on said first and second outer carrier regions and on said band, the contacts on said first and second inner carrier regions being electrically interconnected to one another.

5. A transistor cell element according to claim 2, wherein said first charge carriers are n-type and said second charge carriers are p-type.

* * * * *